(12) United States Patent
Lestable

(10) Patent No.: US 7,594,161 B2
(45) Date of Patent: Sep. 22, 2009

(54) MAP DECODING

(75) Inventor: Thierry Lestable, Staines (TW)

(73) Assignee: Samsung Electronics (UK) Limited (GB)

( * ) Notice: Subject to any disclaimer, the term of this patent is extended or adjusted under 35 U.S.C. 154(b) by 608 days.

(21) Appl. No.: 11/225,262

(22) Filed: Sep. 12, 2005

(65) Prior Publication Data

US 2006/0085728 A1 Apr. 20, 2006

(30) Foreign Application Priority Data

Sep. 10, 2004 (GB) .................................. 0420145.5

(51) Int. Cl.
*H03M 13/03* (2006.01)
(52) U.S. Cl. ...................... 714/794; 714/795; 375/262; 375/341; 702/9
(58) Field of Classification Search ......... 714/794–795; 375/341, 262; 369/59.22; 702/9
See application file for complete search history.

(56) References Cited

U.S. PATENT DOCUMENTS

2004/0158417 A1* 8/2004 Bonet .......................... 702/57

OTHER PUBLICATIONS

James Harrison; "Implementation of a 3GPP Turbo Decoder on a Programmable DSP Core"; Oct. 2001; 9 pages.
H. Padé; "Sur La Représentation Approchée D'une Fonction Par Des Fractions Rationnelles"; Annales Scientifiques de l'ENS, 1892; 92 pages.
H. Padé; "Mémoire Sur Les Développements En Fractions Continues De La Fonction Exponentielle, Pouvant Servir D'introduction À La Théorie Des Fractions Continues Algébriques"; Annales Scientifiques De l'ENS; 1899; 33 pages.
Ohvuchi, Kazuhisa et al.; Turbo Decoder for High-Speed Application in Wideband Code Division Multiple Access System; IEEE 2003; pp. 2355-2359.

* cited by examiner

*Primary Examiner*—Guy J Lamarre
(74) *Attorney, Agent, or Firm*—The Farrell Law Firm, LLP

(57) ABSTRACT

A method of approximating the generation of a logarithm of a sum of exponents, for use in a log-MAP decoding operation, by performing a first operation on the data, calculating a correction term in a second operation, and adding the correction term to the results of the first operation, in which the second operation comprises calculating an approximate correction term by an operation including at least one division stage in which a first result obtained based on said data and at least a first coefficient is divided by a second result obtained based on said data and at least a second coefficient.

16 Claims, 11 Drawing Sheets

MAP DECODING

PRIORITY

This application claims priority under 35 U.S.C. § 119 to an application entitled "MAP DECODING" filed in the Great Britain Property Office on Sep. 10, 2004 and assigned Serial No. 0420145.5, the contents of which are herein incorporated by reference.

BACKGROUND OF THE INVENTION

1. Field of the Invention

This invention relates to decoding. More particularly, this invention relates to decoding using the maximum a Posteriori (MAP) decoding technique. Particularly but not exclusively, the invention is used for decoding turbo encoded signal, and particularly but not exclusively in mobile telecommunication systems.

2. Description of the Related Art

Turbo codes are widely used in challenging communications environments such as mobile telephony because they offer a transmission performance which approaches the Shannon limit in noisy conditions. In turbo coding, two recursive systematic convolutional (RSC) coders are provided in parallel, receiving the same information bits but in different orders.

The output of the turbo coder is the systematic information (the original bit stream) which forms the input to one of the RSC coders, together with the parity outputs of each of the RSC coders. This corresponds essentially to two stochastic processes running on the same input data. At the receiver end, a turbo decoder can operate by independently estimating each of the two processes with a decoder, then refining the estimates by iteratively sharing information between the two decoders. In other words, the output of one decoder can be used as a-priori information by the other decoder.

Each decoder therefore produces a soft output indicating the likelihood that the input bit was a one, referred to as a "log likelihood ratio" (LLR).

Each decoder is arranged to accept the received bit stream (comprising systematic imparity information) together with a-priori information (in the form of an LLR or data derived from it) from the other decoder, and generate an output (which can itself be fed to the other decoder).

The calculations which are performed during each iteration are described in, for example, "Implementation of a 3GSP Turbo Decoder on a Programmable DSP Core", James G. Harrison, 3DSP Corporation White Paper, presented at the Communications Design Conference, San Jose, Calif., Oct. 2, 2001 (www.3dsp.com/pdf/3dspturbowhitepaper.pdf). Briefly, it is not feasible to implement MAP decoding in real time for most commercially desirable data rates at present. Accordingly, simplifications of the MAP algorithm have been sought.

In one, referred to as log-MAP, the simplification is performed by eliminating the substantial number of exponentiation and multiplication operations required by operating in the logarithm domain, so that multiplications become additions and exponentiation is not required. A problem with the log-MAP process is that it is necessary to compute the log of the sum of exponentials. The Jacobian formula provides the following alternative:

$$\log(e^{\delta_1}+e^{\delta_2})=\max(\delta_1,\delta_2)+\log(1+e^{-|\delta_2-\delta_1|}) \quad (1)$$

The first term, the Max (a, b) function, is a single instruction for DSP's (digital signal processors) and is easily performed in any other type of processing device. However, the second term (the correction term) must still be computed. For this, various approaches have been proposed. The simplest approach is to ignore the term altogether. This is referred to as the Max-log-MAP algorithm. It provides a reasonable approximation where (a) is much larger than (b) or vice versa, but leads to errors where they are of similar magnitudes.

The above-mentioned paper by Harrison proposes to use a lookup table of eight entries to approximate the second term. In the paper "Linearly Approximated Log-MAP Algorithms for Turbo Decoding", Cheng & Ottoson, a linear approximation (i.e. a first order approximation, employing a single coefficient) is used which is stated to be particularly suitable for wide band CDMA (WCDMA).

U.S. Pat. No. 6,760,390 (Desai et al) takes a different approach: instead of using the Jacobian substitution to replace the logarithm with the sum of the exponents of several numbers, it uses an alternative expression comprising a first term consisting of the average of the numbers, followed by a second term which must be computed This second term, like the one above, involves taking the logarithms of exponents. It is therefore approximated by using a Taylor series (a power series). To make calculation in real time possible, the Taylor series is truncated after a number of terms which, since the exponential function converges slowly, means that it is of limited accuracy.

Although in these three approaches some attempt is made to take account of the second term, there is inevitably some sacrifice of accuracy for computational efficiency to a greater or lesser extent. The present invention is intended to provide an alternative implementation of the log-MAP algorithm with good accuracy which can be implemented in real time. Under some circumstances, it will provide a more accurate decoding than the above approaches.

In another aspect, the present invention is intended to provide an approximation which is straightforward to implement, and scalable. These aspects are defined in the claims.

In a first aspect, the invention provides a log-MAP type decoder in which the correction term is computed by using a Padé approximant or continued fraction. In each case, the operation includes at least one division stage, as will be clear from what follows, and in contradistinction to the above-referenced prior art.

Padé approximants and their relation to continued fractions are discussed in H. Padé, 'Sur la représentation approchée d'une fonction par des fractions rationnelles', Annales Scientifiques de l'ENS, 1892, and H. Padé, 'Mémoire sur les développements en fractions continues de la fonction exponentielle, pouvant servir d'introduction à la théorie des fractions continues algébriques', Annales Scientifiques de l'ENS, 1899.

SUMMARY OF THE INVENTION

In general, a Padé approximant based on a given number of coefficients (i.e. given a level of complexity) gives a more accurate result than the equivalent series expansion (e.g. McLaurin or Taylor series expansion). For a given level of complexity then, the present invention provides more accurate decoding than the solution proposed in U.S. Pat. No. 6,760,390. It is likewise considerably more accurate than the lookup table or linear approximations described in the above disclosed prior art.

Padé reveals that the approximants which bear his name are closely related to continued fractions (CF). Continued fractions form another alternative method of approximating functions and can be seen as a special case of Padé approximants.

In another aspects, the present invention provides another alternative method of approximating functions by using a repeating continued fraction implementation block (hardware or software).

This aspect of the invention likewise provides good accuracy, and additionally is particularly suited for hardware or DSP software implementation, since it consists of simple repetitive division operations. It therefore enables flexible and scalable implementations. Further, increasing the number of such blocks allows incremental increases of accuracy, so that where there is extra time during decoding, the accuracy can be improved.

The above described aspects may, in a preferred embodiment, be used adaptively; particularly the decoder may test the difference between the two numbers (i.e. vertical line a-b vertical line) and employ the above described aspects only where this difference is relatively small. Where the difference is relatively large, the second term can simply be ignored and, for speed the Max (a, b) term alone can be used.

Preferably, the invention is utilised in a mobile telecommunication system; it may be either at the user terminal end or at the system end, which is particularly useful in the former case where the computation hardware available is more constrained.

BRIEF DESCRIPTION OF THE DRAWINGS

Other aspects, embodiments and preferred features will be apparent from the following description and claims. Embodiments of the invention will now be illustrated, by way of example only, with reference to the accompanying drawings in which:

PREFERRED EMBODIMENTS OF THE INVENTION

Preferred embodiments of the present invention will be described herein below with reference to the accompanying drawings. In the following description, well-known functions or constructions are not described in detail since they would obscure the invention in unnecessary detail.

Figure 1:
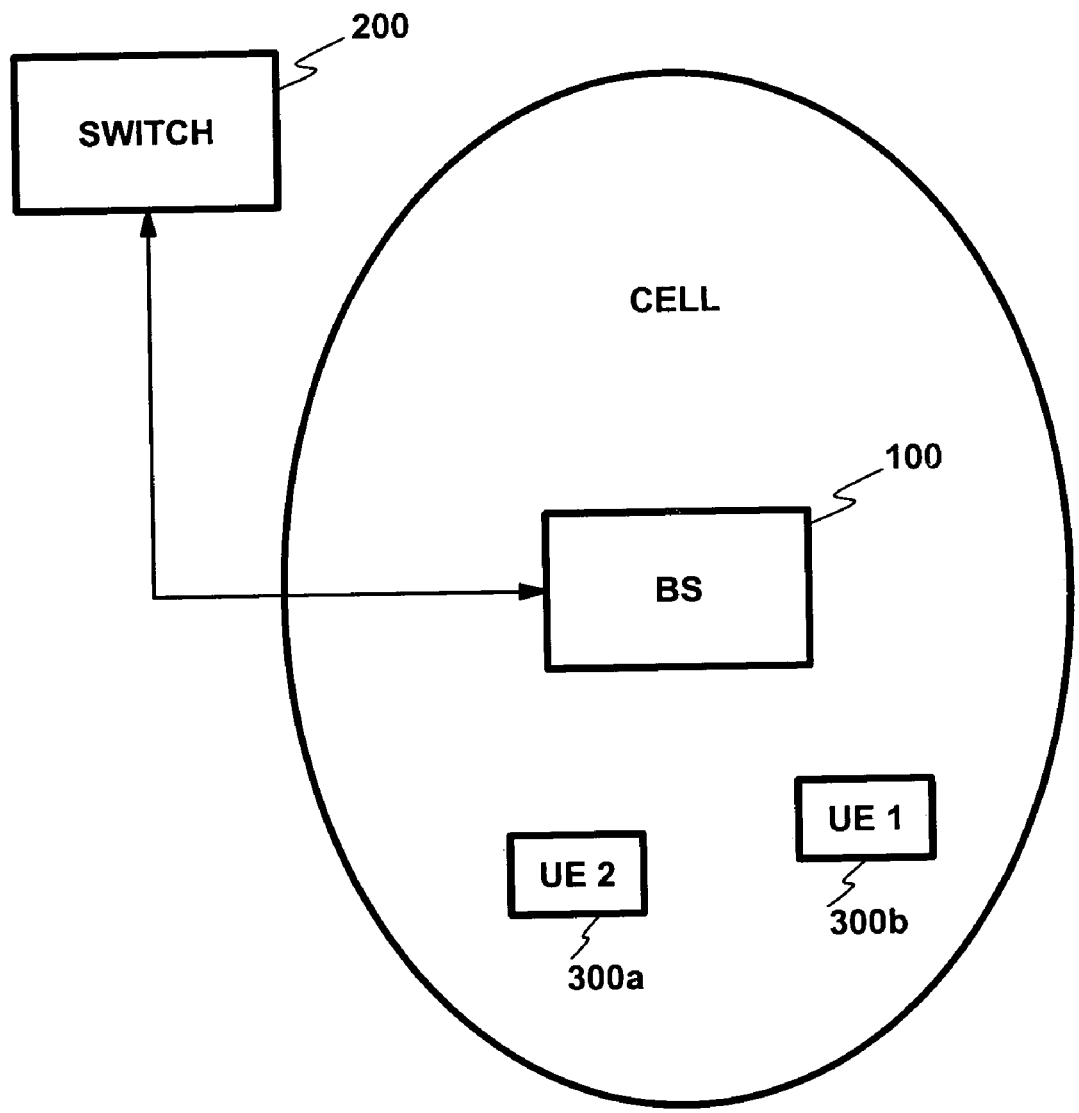
FIG. 1 is a block diagram of the elements of a communications system according to an embodiment of the invention.

Referring to FIG. 1, a communication system such as a mobile telephony system comprises a plurality of user equipment (UE) such as mobile terminals 300a, 300bb, in radio communication with a base station 100, provided within a cell, and having a fixed link connection to a backbone network (such as an IP network) via a switch computer 200. The IP backbone network will not further be discussed since it is of conventional type.

It will be clear to the skilled person that, other than the modulation and RF components, the blocks making up the embodiment at the base station and the mobile terminals comprise suitably programmed digital signal processor devices (DSPs) or ASICs executing signal processing.

In both the base station and the terminals, in order to receive data transmitted over the communications link, the received data are first demodulated, then processed in error control decoders using the redundancy to correct any errors occurred in transmission, such that the data are then available at the receiver's output port (for example for display or audio reproduction).

Figure 2:
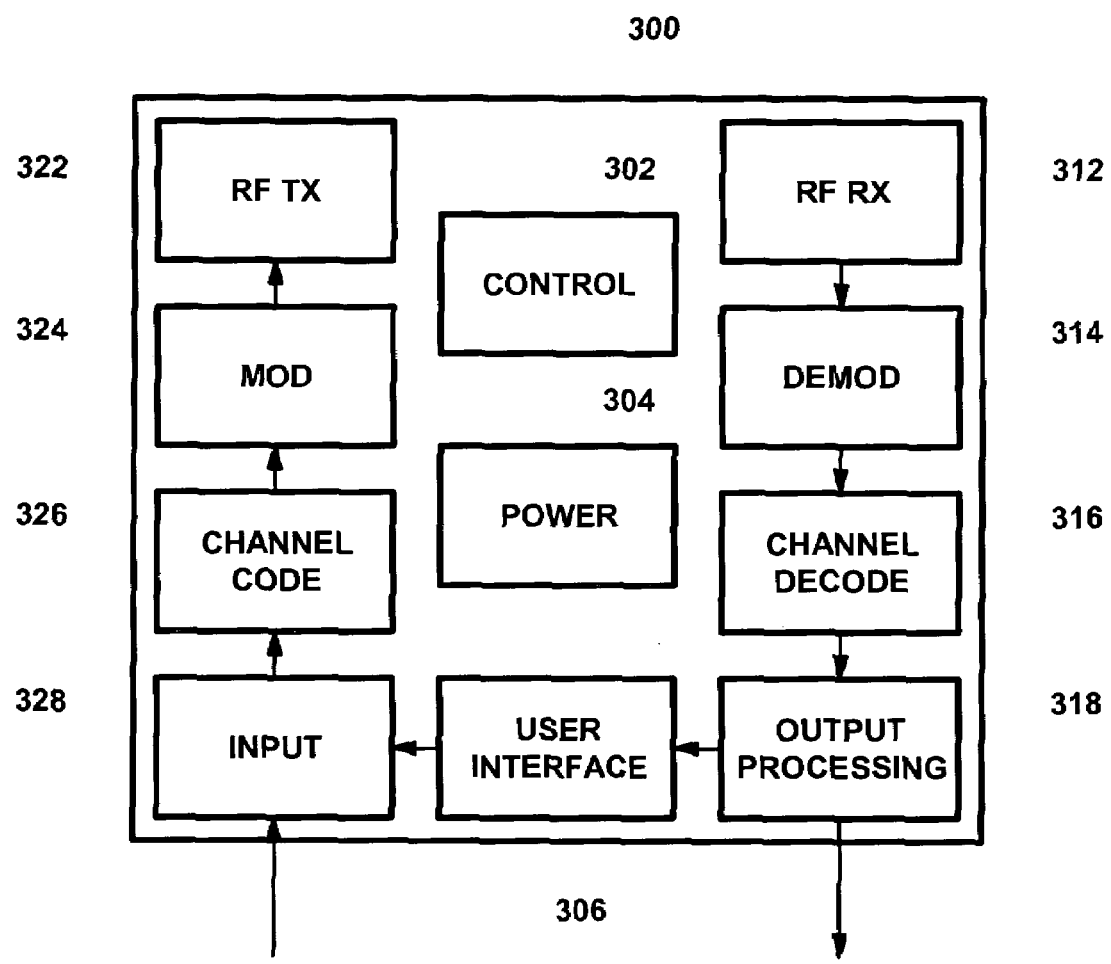
FIG. 2 is a block diagram of the elements of a user equipment mobile terminal forming part of FIG. 1.

Referring to FIG. 2, the mobile terminal 300 comprises a control unit 302 such as a microcontroller, a power supply 304 such as a rechargeable battery, a user interface 306 such as a touch screen. A radio receiver section 312 receives and amplifies radio signals from the network, which are demodulated to base band by demodulator section 314.

Channel decoding is performed by a channel decoder 316, with which the present invention is principally concerned as discussed further below. The decoded data is then passed to an output processing unit 318 in which higher layer processing is performed, for example to remove source coding, reassemble packets and so on, and the output data from the output processing unit 318 is supplied either to the user interface 306 for display, to the control unit 302, or to an output port assumption by an external device.

For completeness, the transmit side components are also shown, comprising a data input processing device 328 applying source coding and packetising; a channel coder 326 for applying channel coding such as turbo coding; a modulator 324 for applying modulation such as quadrature amplitude modulation and modulating at RF, and an RF transmitter device 322 comprising a power amplifier for transmitting the modulated radio signal.

The channel coding and decoding units 316, 326 may be provided by a suitably programmed digital signal processing devices or by a specially designed hardware chip set. The same is true of the input and output processing devices 318, 328. All of these may be integrated into a single unit, suitably programmed, and comprising a digital signal processor with associated RAM flash memory, storing a control program and scratch calculations performed during the operation of the terminal.

The base station 100 includes components generally equivalent to the components 312-318, 322-328 for performing transmission and reception, and will not be further discussed here.

Turbo-Coding & De-Coding

Figure 3:
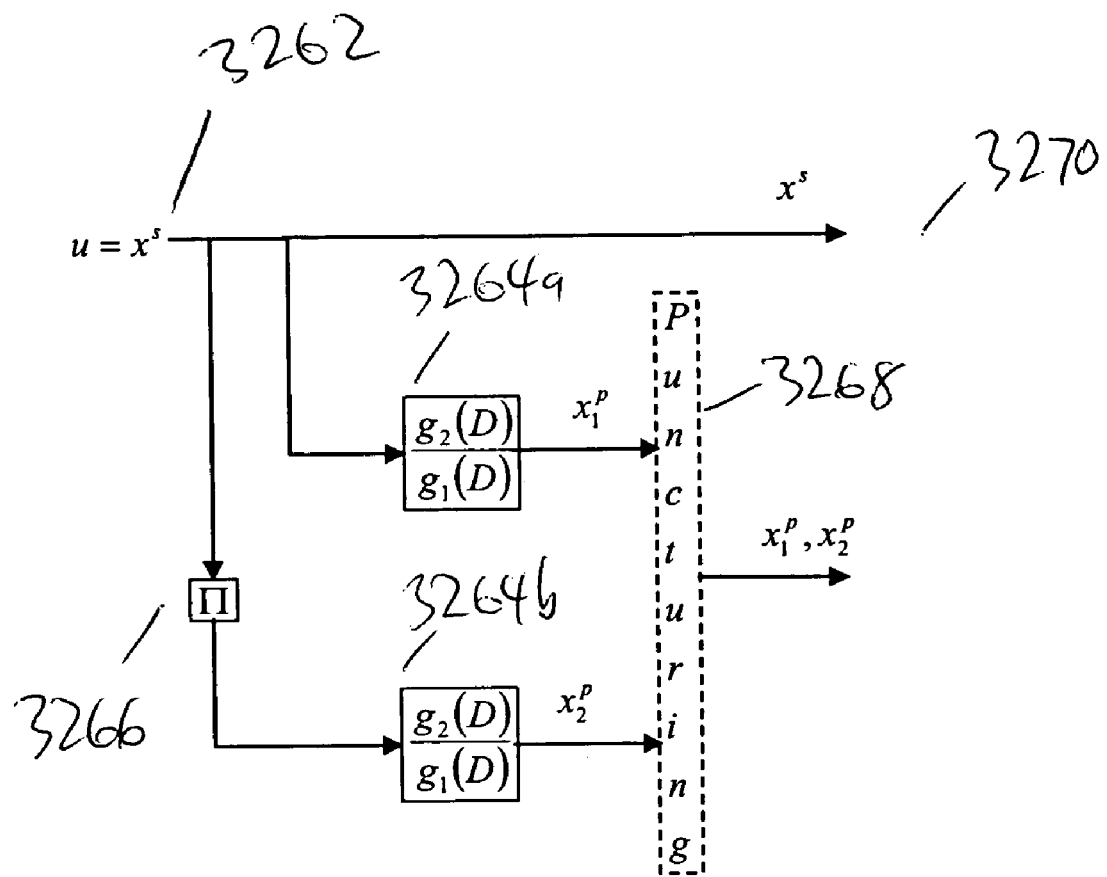
FIG. 3 is a diagram of a Parallel Concatenated Convolutional Coder (Turbo Coder)

Referring to FIG. 3, the channel coder 326 of the user equipment 300, and the equivalent channel coder of the base station 100, comprise a turbo coder consisting of an input port 3262 which accepts an input bit stream; a pair of equivalent recursive systematic convolutional (RSC) encoders 3264a, 3264b fed in parallel from the input port 3262; an interleaver 3266 in the path between the input port and one of the RSC encoders 3264b; a puncturing unit 3268 for varying the coding rate by selectively removing bits from the output stream; and an output port 3270 comprising a multiplexer for multiplexing into a single bit stream the input bit stream from the input port 3262, and the punctured output streams of the encoders 3264a, 3264b via the puncturing unit 3268.

This corresponds to the parallel concatenation of two recursive systematic convolutional (RSC) encoders. These encoders are separated by one interleaving module π. As these encoders are processing the same input bits stream $x^s$, this scheme is referred to as "parallel concatenated convolutional codes" (PCCC).

Each RSC component is composed of two generator polynomials, namely feedback and feedforward polynomials, respectively $g_1$ (D) and $g_2$ (D). Thus, two parity check sequences are generated, namely $x_1^p$, and $x_2^p$.

The turbo-decoding process which takes places in the receivers at the base station and the terminals uses the basic iterative scheme. Again two component decoders, called Soft Input Soft Output (SISO) decoders $D_1$ and $D_2$, are serially concatenated via an interleaving process. The major key feature of this iterative process, is that the extrinsic information delivered by one SISO decoder, feeds the following SISO decoder as a priori information for decoding information bits. The feedback loop iteratively improves the performance of this scheme.

Figure 4:
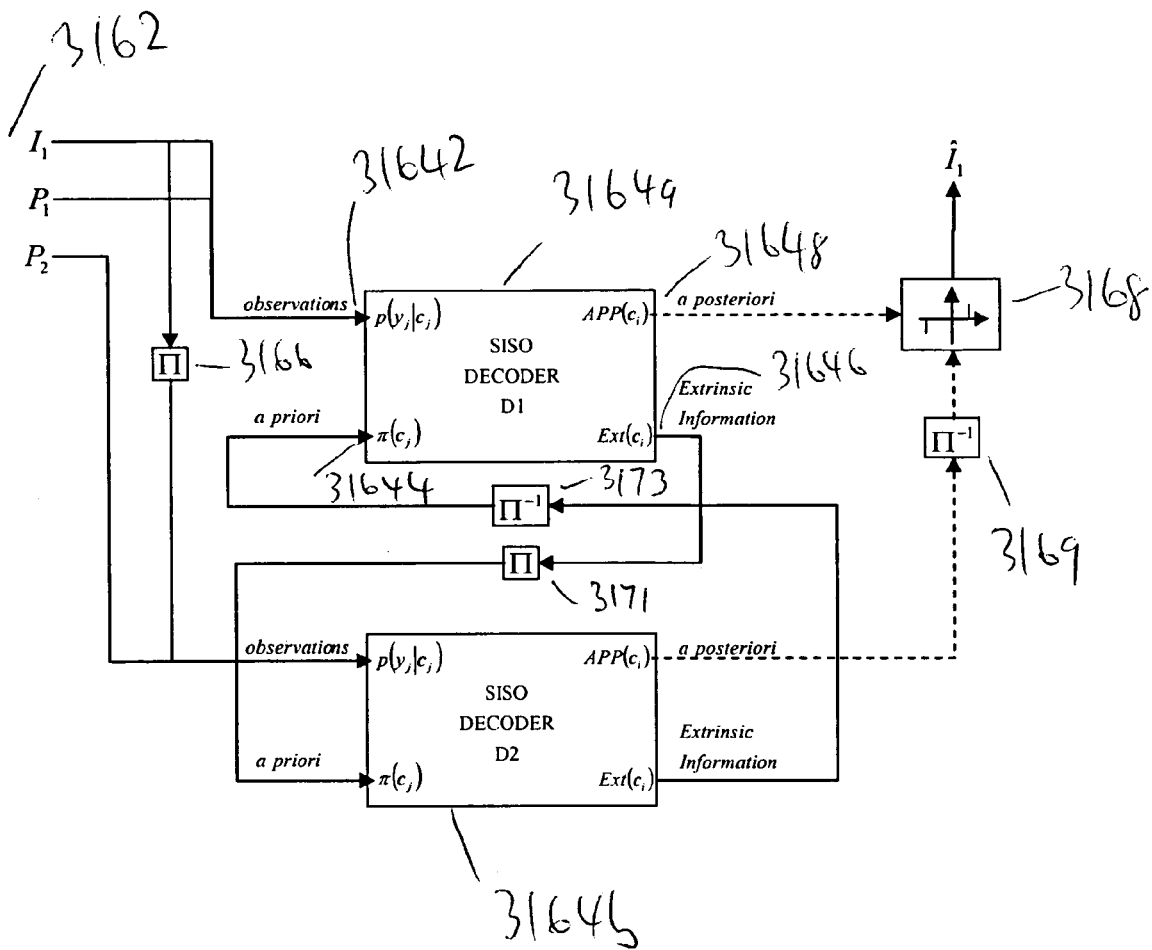
FIG. 4 is a diagram of an iterative Turbo-Decoder (MAP decoder)

Referring to FIG. 4, the decoder 316 comprises an input port 3162 at which the received modulated samples (represented as multibit data) are demultiplexed into a data stream and two separate parity streams. Each parity stream is fed in parallel to a respective soft input soft output (SISO) decoder 3164a, 3164b. An interleaver 3166 of depth equivalent to the interleaver 3266 decoder lies in the path from the input port 3162 to the second decoder 3164b.

Each of the coders 3164 has four ports. A first input port 31642 (shown only on the first decoder 3164a for clarity) accepts the observation samples from the input port 3162 and a second 31644 accepts a-priori information from an extrinsic information output port 31646 of the other decoder. Finally, an a posteriori output port supplies decoded output bits from each decoder 3164 to a combiner and thresholder 3168 at which the decoded bit-stream is made available as a series of binary bits.

In the output path from the second decoder 3164b to the output port 3168 is an output deinterleaver 3169.

Interconnecting the output port 31646 of the first decoder and the a-priori input port 31644 of the second decoder 3164b is an interleaver 3171. Conversely, interconnecting the output port 31646 of the second decoder 3164b with the a-priori input port 31644 of the first decoder 3164a is a deinterleaver 3173.

Figure 5:
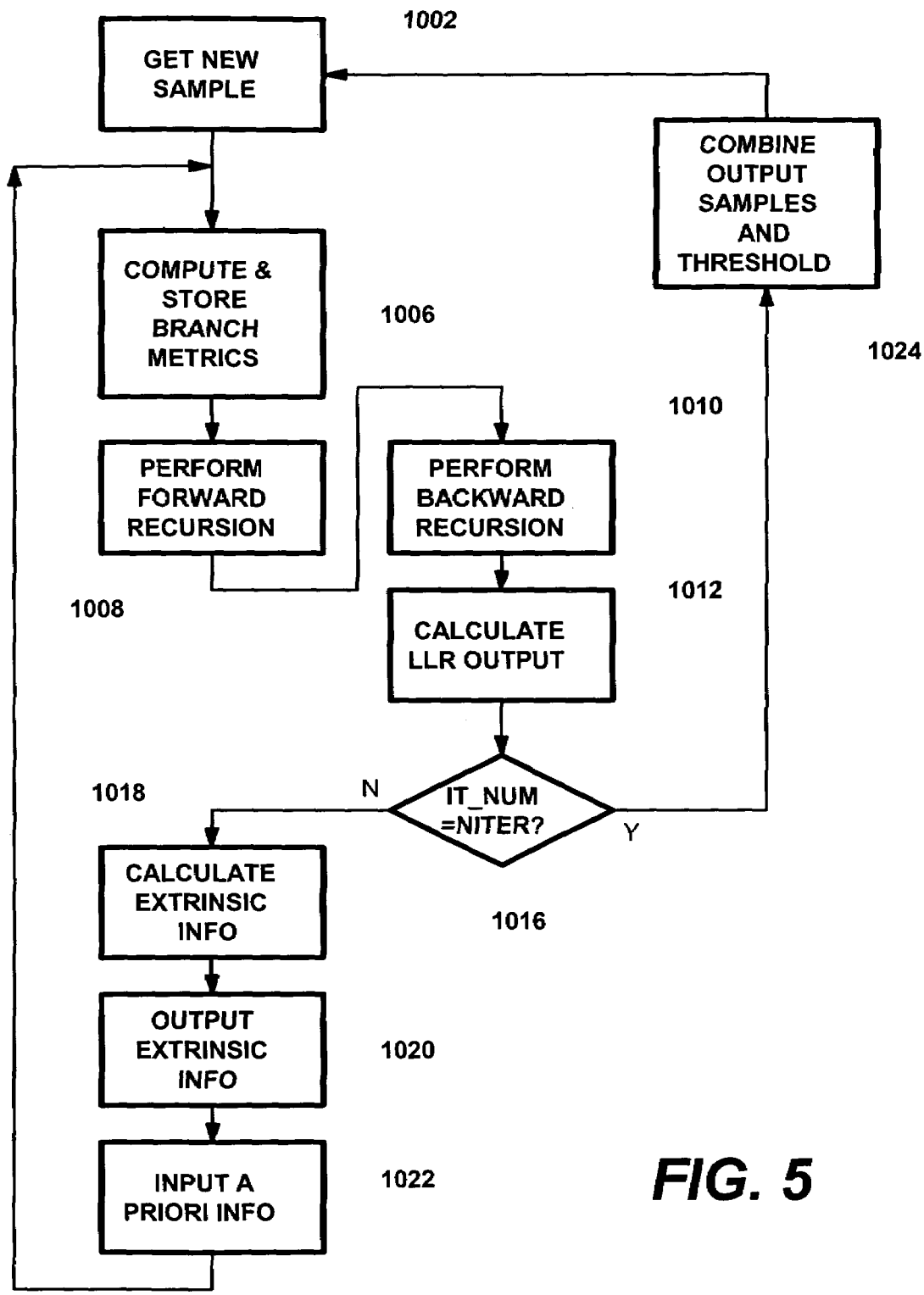
FIG. 5 is a flow diagram of the process of iterative Turbo-Decoding.

Referring to FIG. 5, an overview of the operation of the decoder of FIG. 4 will be given.

Step 1002, a new demodulated sample (in the form of a 32 bit value from the demodulator) is received at the input port.

In step 1006, each decoder computes and stores the branch metrics (often referred to as gamma values) for all trellis branches. The skilled person is aware that a trellis diagram is a representation of the different states applied by the modulator over a succession of bit periods (equal in length to the length of the interleaver plus a predetermined number of periods for flushing the encoder back to an initial state). The decoder attempts to trace the path through the trellis taken by the signal by calculating the state transition probability.

The branch metrics (gamma values) are calculated based on the distance between the hard coder values and the received values from the demodulator, taking into account the channel noise variants, multiplied by the a-priori input from the other decoder.

After computing and storing the branch metrics, in step 1008, each decoder performs a forward recursion on the trellis by computing forward (alpha) probabilities for each node on the trellis. The alpha values are the sum of the previous alpha multiplied by the branch metric along each branch from the two previous nodes to the node in question.

In step 1010, each decoder performs backward recursion to calculate backwards (beta) probabilities for each node, similarly to the forward recursion but starting at the end of the trellis and going backward.

In step 1012, the log likelihood ratio (LLR) for each time t is calculated as the sum of the products of the alphas, betas and gammas at that time for each branch associated with a one value in the encoder, divided by the sum of the products of the alphas, betas and gammas for each branch associated with a zero.

In step 1016, the decoders determine whether the maximum number of iterations (for example, four iterations), Niter, has been reached. If not, then in step 1018 each decoder calculates extrinsic information to be fed from each coder to the other is calculated as the difference between the LLR and the input probability estimate and in step 1020 outputs the extrinsic information at its output port.

In step 1022, each of the two decoders accepts a new a-priori value from the other decoder.

When all iterations have been complete (step 1016) the output device thresholds the log likelihood ratio outputs of the two decoders to form the decoded output bit. If the bit rate is sufficiently slow, the test 1016 may determine whether the decoded outputs have converged, rather than applying a limited number of iterations.

Within the forward and backward recursion steps 1008, 1010 in particular, the calculation of the alpha and beta probabilities involves the approximation to the log of the sum of the exponentials of plural numbers, as discussed above. In other respects, the process described in relation to FIG. 4 is entirely conventional and well known to the skilled person. At this stage, therefore the present embodiment uses the approximation based on Padé approximants which will be described below. First, the necessary mathematical relationships will be laid out.

The MAP algorithm, given below, represents the optimal soft-output processing:

$$\Lambda(c_t) = \log\left[\frac{\sum_{(l,l') \in B_t^1} \alpha_{t-1}(l') \cdot \gamma_t^1(l', l) \cdot \beta_t(l)}{\sum_{(l,l') \in B_t^0} \alpha_{t-1}(l') \cdot \gamma_t^0(l', l) \cdot \beta_t(l)}\right] \quad (2)$$

This computation is performed by the forward-backward algorithm.

In step 1018, the extrinsic information to be fed from each coder to the other is calculated as the difference between the LLR and the input probability estimate.

Max-Log-MAP Algorithm

To reduce the complexity, the log-domain is used.

$$\overline{\gamma}_t^i(l',l) = \log[\gamma_t^i(l',l)] \quad (3)$$

$$\overline{\alpha}_t(l) = \log[\alpha_t(l)] \quad (4)$$

$$\overline{\beta}_t(l) = \log[\beta_t(l)] \quad (5)$$

Then the soft-output expression (i.e. the LLR) becomes:

$$\Lambda(c_t) = \log\left[\frac{\sum_{(l,l') \in B_t^1} e^{\overline{\alpha}_{t-1}(l') + \overline{\gamma}_t^1(l',l) + \overline{\beta}_t(l)}}{\sum_{(l,l') \in B_t^0} e^{\overline{\alpha}_{t-1}(l') + \overline{\gamma}_t^0(l',l) + \overline{\beta}_t(l)}}\right] \quad (6)$$

Now, the complexity reduction is obtained by means of the following approximation (the Jacobian relation, with the correction term omitted):

$$\log\left[\sum_{i=1}^{n} e^{\delta_i}\right] \approx \max_i\{\delta_i\} \quad (7)$$

This reduces the complexity considerably, as the previous soft-output reduces to:

$$\Lambda(c_t) \approx \quad (8)$$
$$\max_l[\overline{\gamma}_t^1(l', l) + \overline{\alpha}_{t-1}(l') + \overline{\beta}_t(l)] - \max_l[\overline{\gamma}_t^0(l', l) + \overline{\alpha}_{t-1}(l') + \overline{\beta}_t(l)]$$

However, this complexity reduction works only by impacting the performance—the Bit Error Rate (BER) performance falls.

Log-MAP Algorithm

This version is an extension of that above.

So the previous approximation is applied, but additionally with a correction function:

$$\log(e^{\delta_1} + e^{\delta_2}) = \max(\delta_1, \delta_2) + \log(1 + e^{-|\delta_2 - \delta_1|}) \quad (9)$$

$$\log(e^{\delta_1} + e^{\delta_2}) = \max(\delta_1, \delta_2) + f_c(|\delta_2 - \delta_1|) \quad (10)$$

with $f_c(x) = \log(1 + e^{-x})$. The term (x) corresponds to the absolute difference between the two values.

For some summation with more terms, the following recursive algorithm can be used:

Let's note first $$\Delta_{n-1} = \sum_{k=1}^{n-1} e^{\delta_k}, \quad (11)$$

To process log $$\left[\sum_{k=1}^{n} e^{\delta_k}\right] = \log\left[\sum_{k=1}^{n-1} e^{\delta_k} + e^{\delta_n}\right] = \log[\Delta_{n-1} + e^{\delta_n}] \quad (12)$$

So, from the above equations this leads to the following relation:

$$\log[\Delta_n] = \max(\log[\Delta_{n-1}], \delta_n) + f_c(|\log[\Delta_{n-1}] - \delta_n|) \quad (13)$$

$$\log[\Delta_n] = \max(\overline{\delta}^{n-1}, \delta_n) + f_c(|\overline{\delta}^{n-1} - \delta_n|) \quad (14)$$

Where $\Delta_{n-1} = e^{\overline{\delta}^{n-1}}$, or equivalently $\log[\Delta_{n-1}] = \overline{\delta}^{n-1}$ Finally, with this notation:

$$\overline{\delta}^n = \max(\overline{\delta}^{n-1}, \delta_n) + f_c(|\overline{\delta}^{n-1} - \delta_n|) \quad (15)$$

Padé Approximant

Now follow some details about the Padé approximants theory. To approximate the following McLaurin series:

$$A(x) = \sum_{j=0}^{+\infty} c_j \cdot x^j \quad (16)$$

One approximation method is the use of special rational functions, called Padé approximants, and defined as the following:

$$R_{L/M} \equiv [L/M] = \frac{P_L(x)}{Q_M(x)} \quad (17)$$

Where $$P_L(x) = a_0 + a_1 \cdot x + \ldots + a_L \cdot x^L \quad (18)$$

$$Q_M(x) = 1 + b_1 \cdot x + \ldots + b_M \cdot x^M \quad (19)$$

It is therefore seen that they correspond to the ratio of two power series, P and Q. These series may contain different numbers of terms (i.e. be of different orders). The order of the Padé approximation is the sum of the orders of the series—for example, if the numerator series is third order and the denominator series is second order, then the Padé approximation is fifth order.

Finally, the approximation reaches the following target:

$$A(x) = [L/M] + O(x^{L+M+1}) \quad (20)$$

Approximation of Logarithm Function

The aim in this embodiment is to provide an accurate, and low complexity, approximation to the correction function used within the Log-MAP algorithm above which is in the form $f_c(x)=\log(1+e^{-x})$, in order to both reduce the overall complexity of the decoder, whilst maintaining a good performance.

We will thus use the two following Padé Approximants:

e.g. for order 3, $$\exp_{1/2}(x) = \frac{6+2 \cdot x}{6-4 \cdot x + x^2} \quad (21)$$

$$\log_{2/1}(1+x) = x \cdot \left[\frac{6+x}{6+4 \cdot x}\right] \quad (22)$$

After some basic manipulations:

$$\log(1+e^x) \cong \left[\frac{6+2 \cdot x}{6-4 \cdot x + x^2}\right] \cdot \left[\frac{6 \cdot x^2 - 22 \cdot x + 42}{6 \cdot x^2 - 16 \cdot x + 60}\right] \quad (23)$$

The desired correction function (of the absolute difference between the two values) to add to the maximum of the two values is therefore calculated in this embodiment using the above relation, involving simple multiplication/division and addition/subtraction operations and a small number of simple integer coefficients.

As distinct from conventional expansion series which employ (or are resolvable to) multiplication and addition of coefficients and powers of the absolute difference value, the present embodiment necessarily involves division operations since the approximation involves the ratio of two power series.

It will now be clear that, in the steps in FIG. 4 where the alpha, beta and gamma values are calculated, in each case the present embodiment calculates a first term, comprising the maximum of the values, calculates the absolute difference between the two values, and calculates a second, correction, term, from the absolute difference, using Equation (23).

Resulting Performance of First Embodiment

Figure 6:
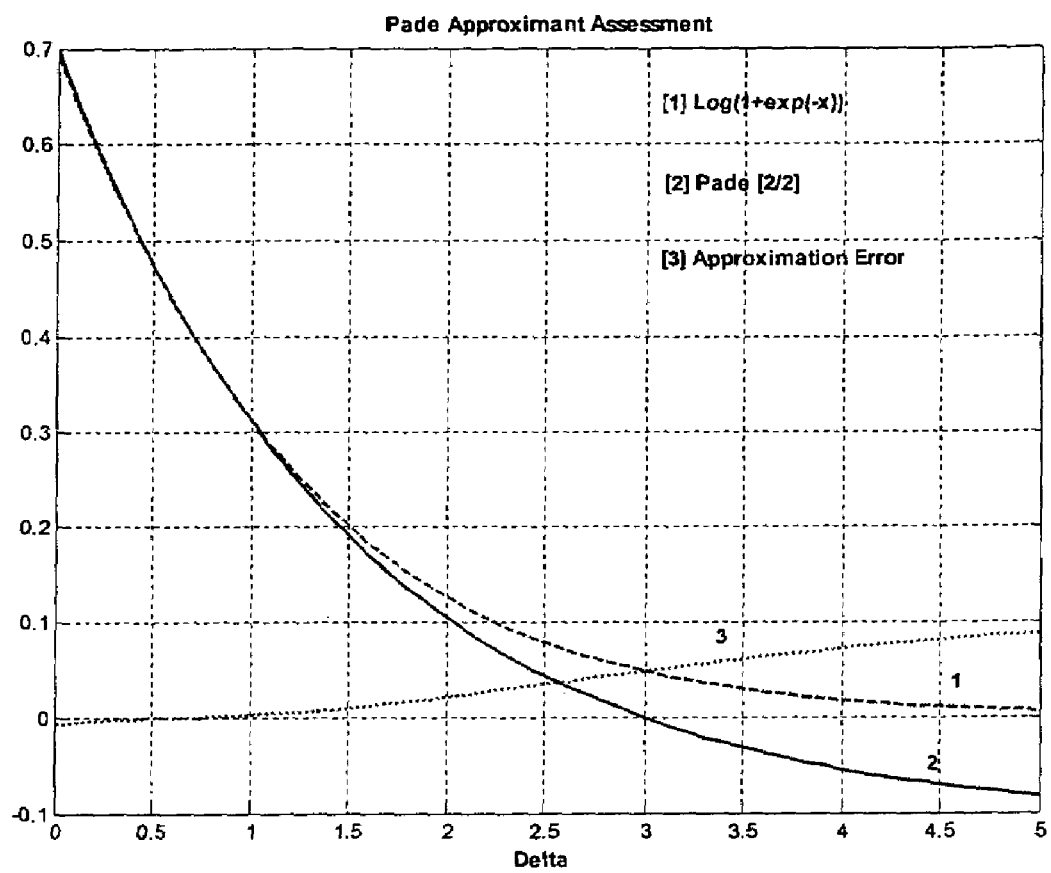
FIG. 6 is a plot of analytical function values against approximated function values according to the first embodiment.

FIG. 6 shows the estimated error introduced when applying the Padé approximation of this embodiment instead of the actual correction function (which, of itself, is time-consuming to calculate). Note from FIG. 6 that the accuracy appears adequate, and the error increases only from 2.5.

Estimation of Error in Prior Art.

Figure 7:
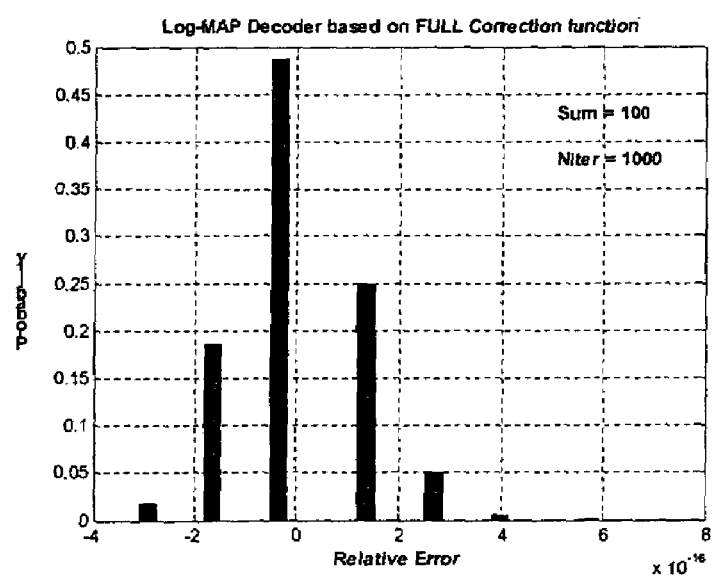
FIG. 7 is a plot of probability density function (PDF) against relative error for a prior art 1-MAP decoder.
Figure 8:
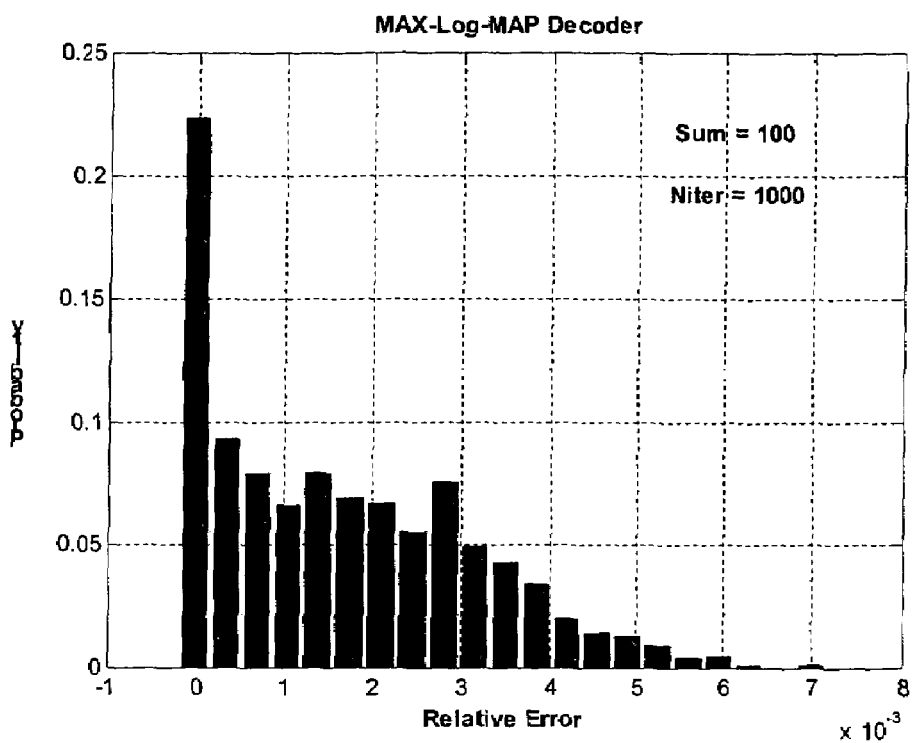
FIG. 8 corresponds to FIG. 6 and is a plot of probability density function (PDF) against relative error for a prior art MAX Log-MAP decoder.

When using the full logarithmic correction function of Equation (1), the optimal probability density function (PDF) of FIG. 7 would be obtained. Now, applying the same technique, when estimating log of a sum of exponentials, with random values, the probability density function (PDF) of FIG. 8 would be obtained when applying only the prior art max-log-MAP algorithm of Equation (7). Clearly, this is much worse than that of FIG. 7; it is one-sided, and has a wider band.

Estimation of Error with Padé Based Aproximant According to this Embodiment.

Figure 9:
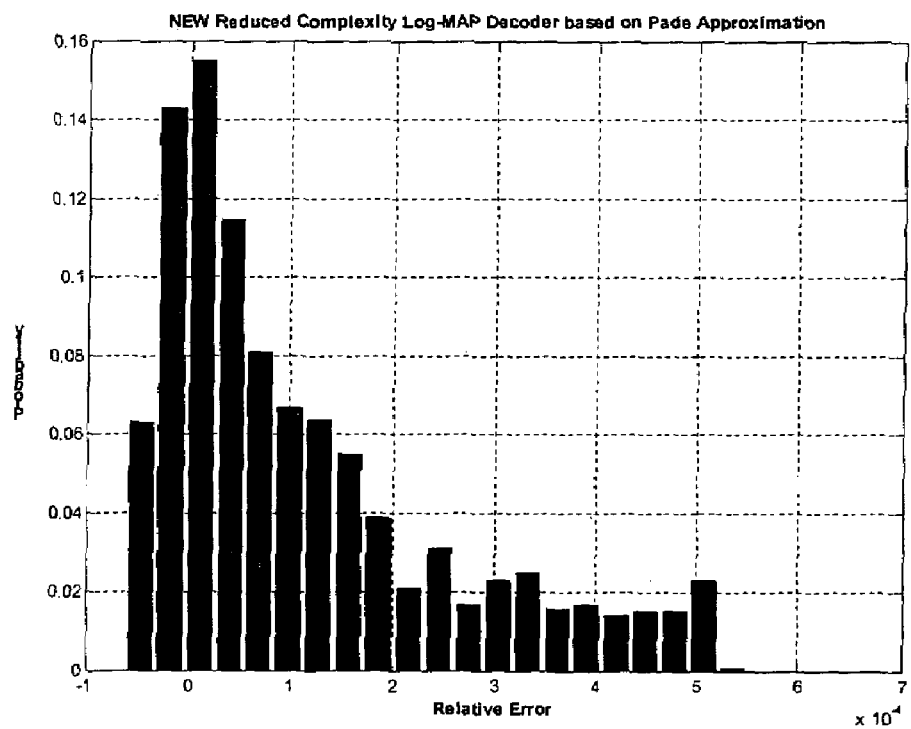
FIG. 9 is a plot of probability density function (PDF) against relative error for the analytic values of a MAP decoder according to the first embodiment.
Figure 10:
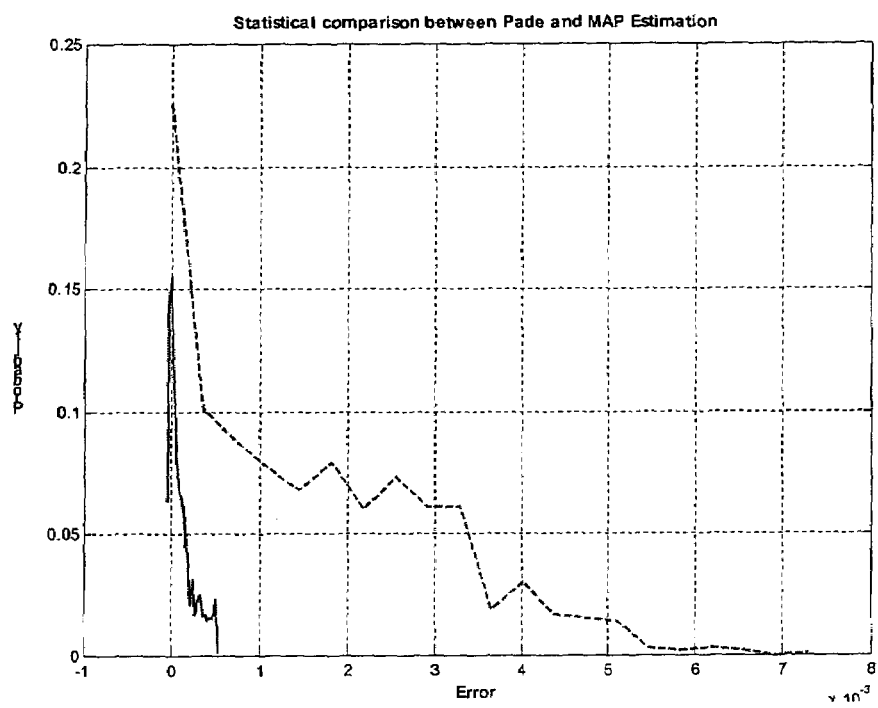
FIG. 10 is a plot of probability against error for a decoder according to the first embodiment as against a MAX Log-MAP decoder.
Figure 11:
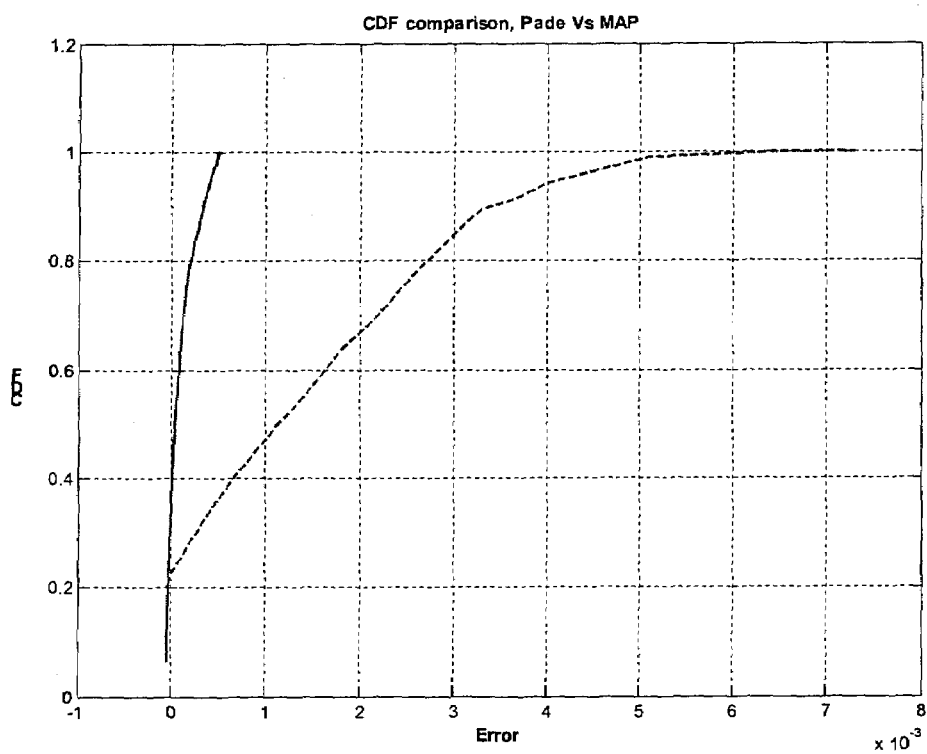
FIG. 11 is a plot of CDF against error for a decoder according to the first embodiment as against a MAX Log-MAP decoder.
Figure 12:
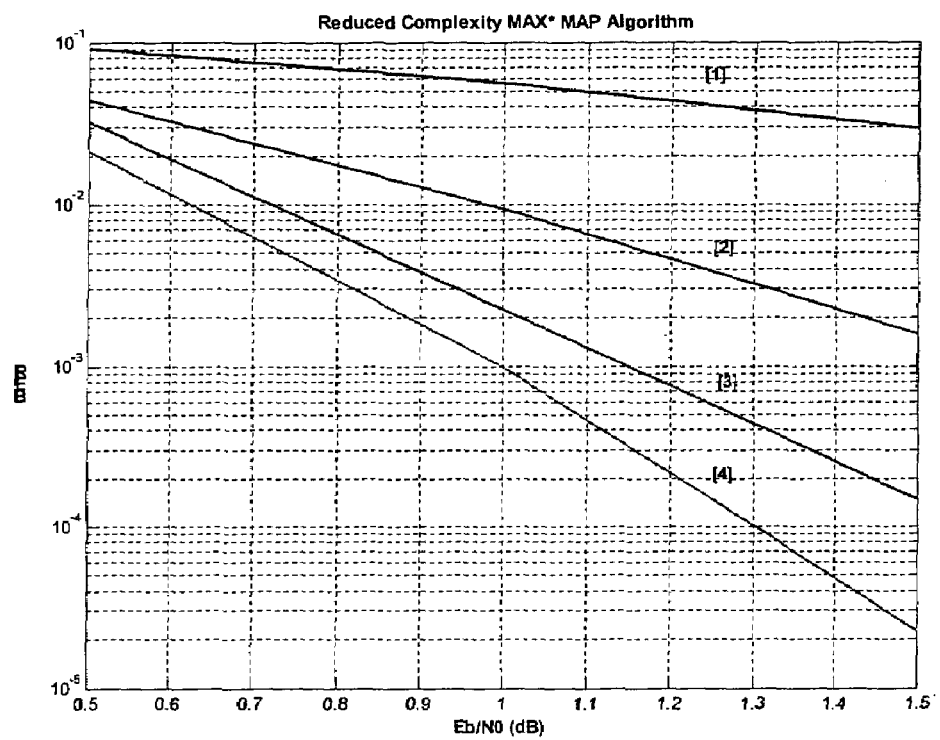
FIG. 12 is a plot of Bit Error Rate (BER) against noise for different numbers of iterations (1-4) for the MAX*-Log-MAP decoder.
Figure 13:
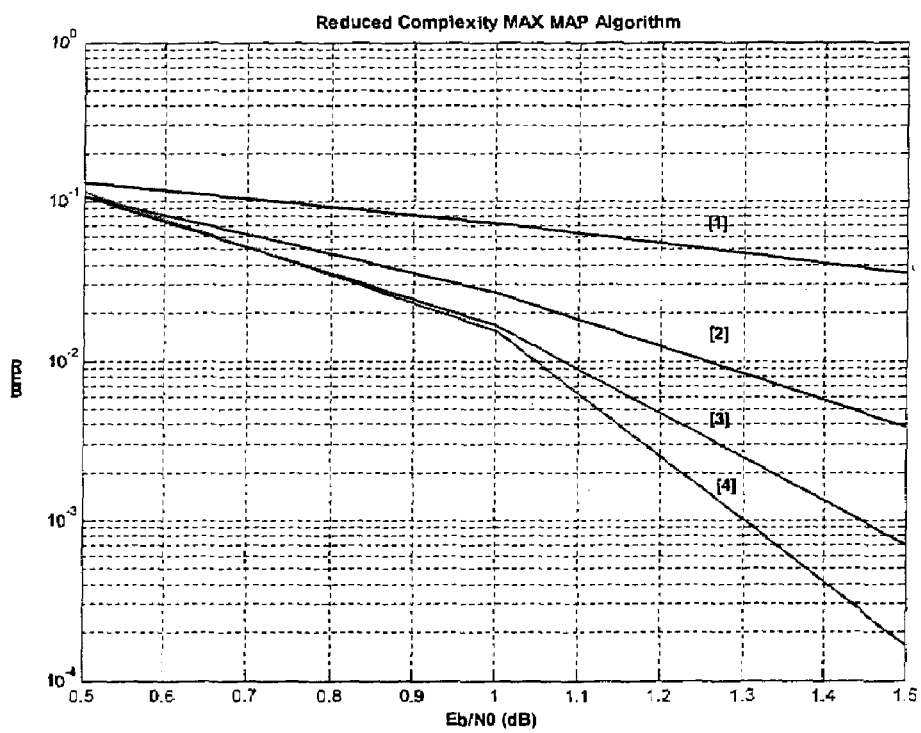
FIG. 13 is a plot of Bit Error Rate (BER) against noise for different numbers of iterations (1-4) for the MAX-Log-MAP decoder.
Figure 14:
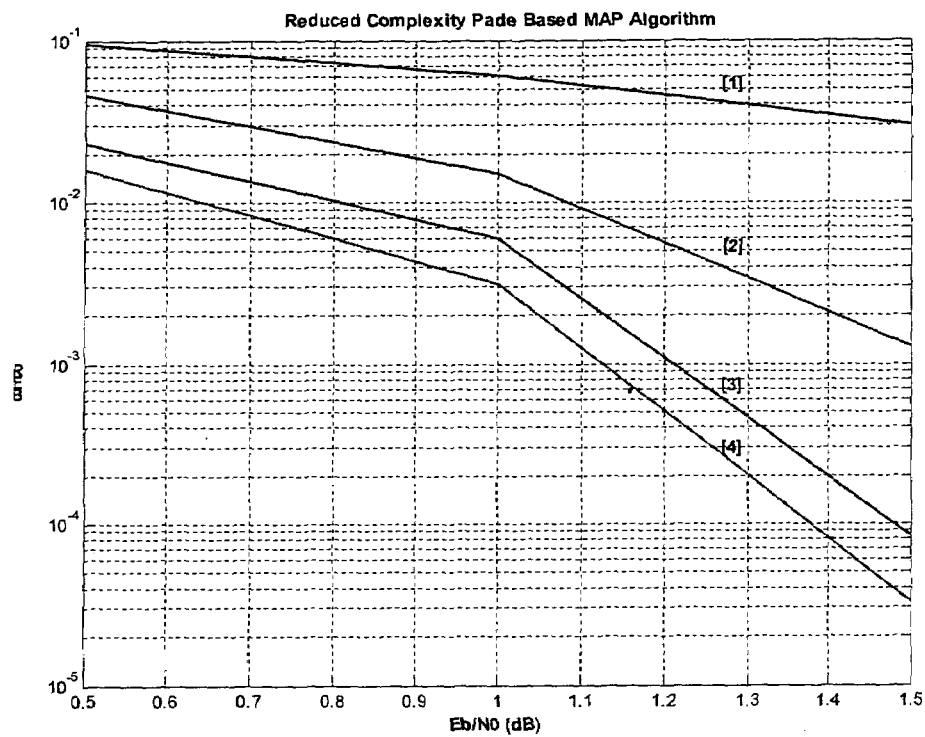
FIG. 14 is a plot of Bit Error Rate (BER) against noise for different numbers of iterations (1-4) for the approximated Log-MAP decoder according to a first embodiment.

The same error distribution for the present embodiment is shown in FIG. 9. Obviously, the distribution is considerably better than that of FIG. 8. The difference is emphasised by the comparison shown in FIG. 10. The related CDF is depicted in FIG. 11.

Bit Error Rate (BER) Assessment

Log-MAP Algorithm (MAX*) Turbo-Decoding

FIGS. 12 to 15 show that the new decoder has a somewhat similar performance to the Log-MAP (MAX*), and considerably better performance than the simple MAP algorithm. Thus, this embodiment offers a good, low-complexity (low order) yet high accuracy approximation to the optimal method of applying the log-MAP decoding algorithm.

Figure 15:
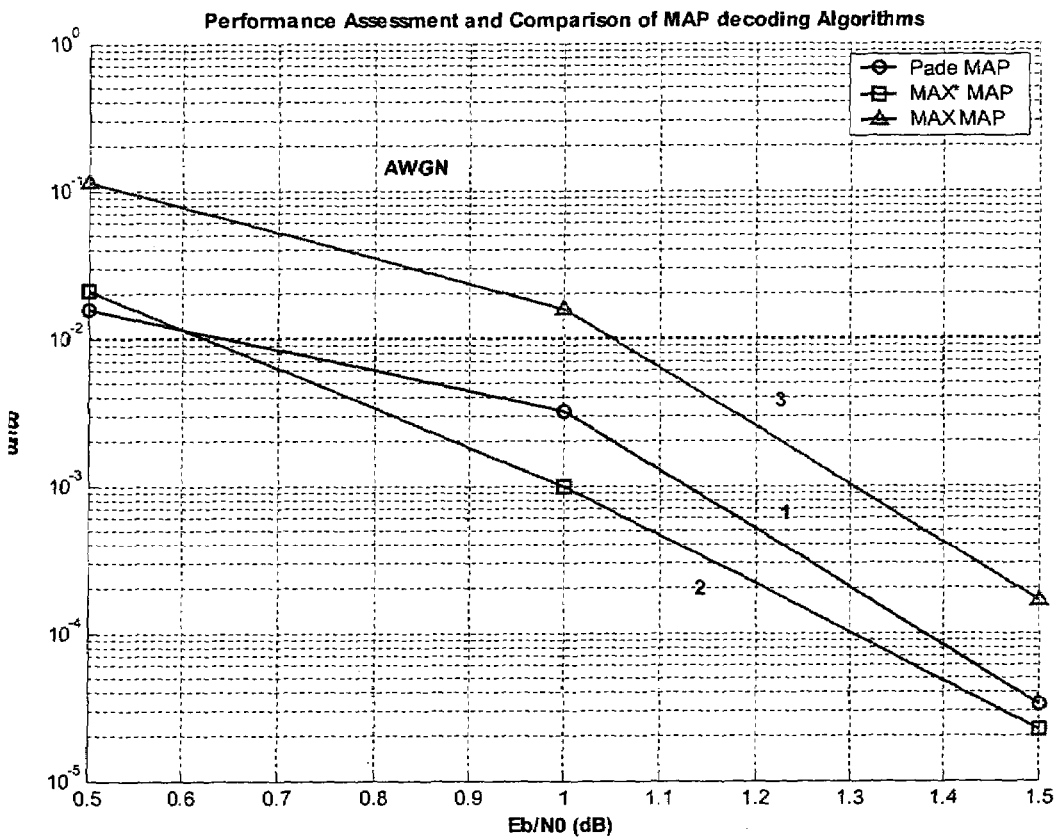
FIG. 15 is a plot of Bit Error Rate (BER) against noise for 4 iterations for the present embodiment against the prior art.

From the FIG. 15 full comparison, it is clear that the complexity reduction obtained by means of the use of rational approximants of Padé, has nonetheless maintained a good performance. That means that this technique could be a good candidate for future 4G receiver implementation of turbo-decoding scheme.

Second Embodiment

The above embodiment describes the use of the Padé approximants; for example, the third order approximant described in equation (23). In this embodiment, however, the use of the closely related continued fraction approximation technique is described. Padé's work explain the close relationship between Padé approximants and continued fractions, and shows how to convert between one representation and the other.

In this embodiment, continued fraction are employed firstly to obtain the same level of accuracy as the first embodiment, but secondly for the implementation advantages which will be described below.

By way of an example, the exponential function will be reviewed here in view of its very low convergence when represented as a McLaurin or Taylor series (so that it is poorly modelled by such series unless a large number of coefficients are provided).

It can be found that Padé approximants have an explicit representation given below:

$$P_L(x) = \sum_{k=0}^{L} \frac{(L+M-k)! \cdot L!}{(L+M)! \cdot k! \cdot (L-k)!} \cdot x^k \quad (24)$$

$$Q_M(x) = \sum_{k=0}^{M} \frac{(L+M-k)! \cdot M!}{(L+M)! \cdot k! \cdot (M-k)!} \cdot (-1)^k x^k \quad (25)$$

It can be shown that the continued fraction expansion of the exponential function can be described by the sequence of following matrices:

$$\begin{pmatrix} A_n & B_n \\ C_n & D_n \end{pmatrix} = \prod_{h=0}^{n} \begin{bmatrix} (2h+1)+x & (2h+1) \\ (2h+1) & (2h+1)-x \end{bmatrix} \quad (26)$$

We will thus derive the continued fraction of the following approximant:

$$\exp_{1/2}(x) = \frac{6+2\cdot x}{6-4\cdot x+x^2} \qquad (27)$$

|   | 0 | 1 | 2 |
|---|---|---|---|
| 0 | +1 | −2/3 | +1/6 |
| 1 | +1 | +1/3 | 0 |
| 2 | −1 | +1/6 | 0 |
| 3 | −1/2 | 0 | 0 |
| 4 | −1/12 | 0 | 0 |
| 5 | 0 | 0 | 0 |

Therefore the decomposition in continued fractions can be straightforwardly re-written as the standardized expression:

$$\text{Exp}_{[1/2]}(x) = \left[0; \frac{1}{1}; \frac{-x}{1}; \frac{-1/2\cdot x}{-1}; \frac{-1/12\cdot x}{-1/2}\right] \qquad (28)$$

For the purpose of the new design implementation to be described, this can be written as:

$$\text{Exp}_{[1/2]}(x) = \cfrac{1}{1 - \cfrac{x}{1 - \cfrac{1/2\cdot x}{-1 - \cfrac{1/12\cdot x}{-1/2}}}} \qquad (29)$$

Or after basic divisions, and algebraic manipulations:

$$\text{Exp}_{[1/2]}(x) = \cfrac{1}{1 + \cfrac{\alpha_2 x}{1 + \cfrac{\alpha_3 x}{1 + \alpha_4 x}}} \qquad (30)$$

where $\alpha_2 = -1; \alpha_3 = \frac{1}{2}; \alpha_4 = -\frac{1}{6}$

Figure 16:
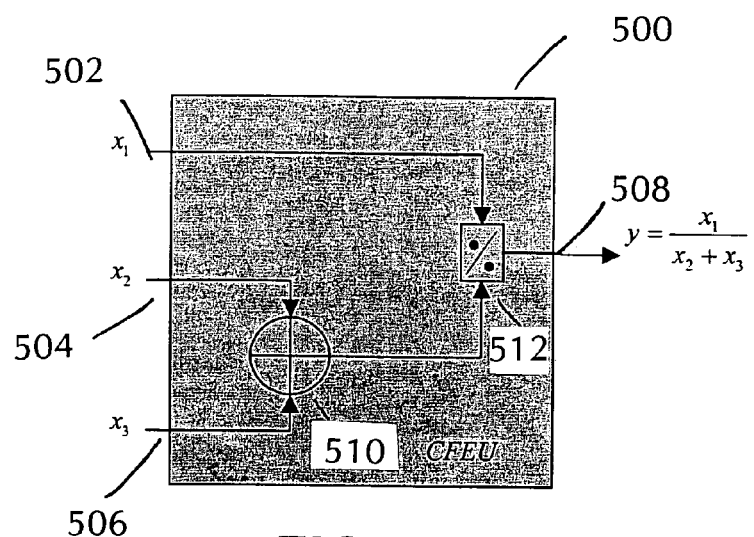
FIG. 16 is a block diagram of a continuous fraction evaluation unit according to a second embodiment of the invention.

FIG. 16 shows a continued fraction evaluation unit according to the present invention. It comprises three input terminals, 502, 504, 506 and an output terminal 508. The lower two input terminals 504, 506 are connected to an adder 510. A divider 512 is provided. The first input terminal is connected to the numerator input of the divider 510 and the output of the adder 508 is connected to the denominator input of the divider 510. The output of the divider 510 is connected to the output port.

Thus, where the values of the input ports are, respectively $x_1$, $x_2$, $x_3$ then the value of y at the output port is given by:

$$y = x_1/(x_2+x_3).$$

Figure 17:
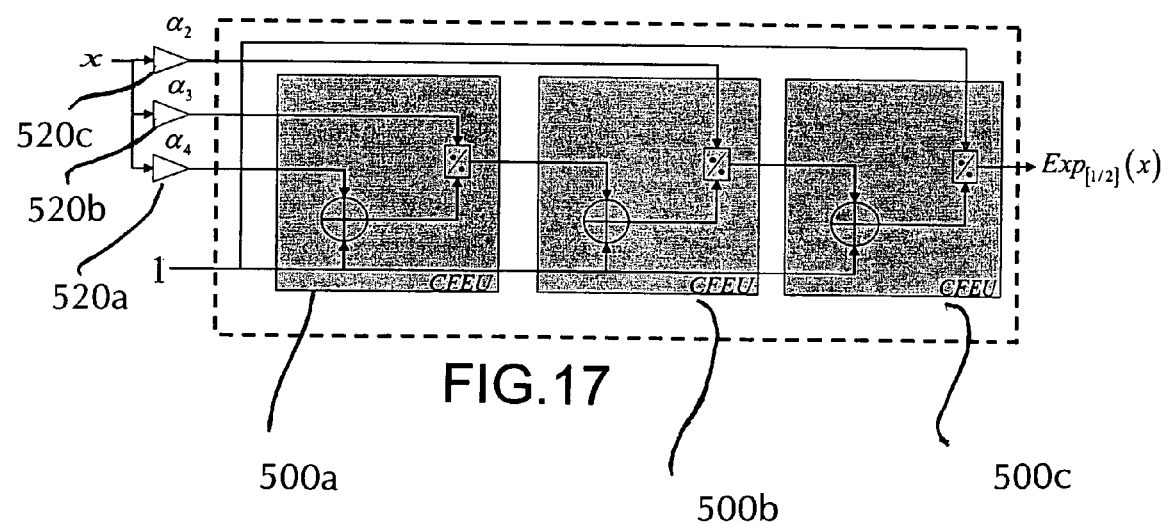
FIG. 17 is a block diagram of a cascade of continuous fraction evaluation units according to the second embodiment.

Referring to FIG. 17, a respective scalar multiplier 520 is provided with each of the units shown in FIG. 16. A plurality of units 500 of the type shown in FIG. 16 are provided arranged in cascade. The output port of the first unit is connected to the middle input port (leading to the adder 508) of the next, and so on until the last. The first input port of each (connected to the denominator of the divider 510) is connected to the output of its respective scalar multiplier 520, except for the first (of which the scalar multiplier is connected to the second input terminal brackets leading to the adder).

In all units, the first input terminal (leading to the adder 508) is connected to a constant having the value 1, as is the last input terminal (leading to the denominator of the divider 510) over the last unit 500c. Each of the multipliers 520 multiplies by a respective coefficient alpha.

In operation, then, it will be clear that the structure described in the FIG. 17 represents a very simple and scalable structure for performing the calculation of equation 29, to calculate approximate exponentials of the number supplied in parallel to the imports of the multipliers 520. Strictly, the adders 508 in this case are merely performing an increment instruction and do not require an external input, but for more general functions, a different scalar could be used.

A more accurate calculation can be provided simply by appending further such units (and changing the values of the coefficients appropriately). Whilst exponentiation has been described as a particular case where the continued fraction approximation has substantial advantages over conventional series expansions due to the low convergence, any Padé approximant (such as that disclosed in equation 23) can be transformed into a continued fraction representation as mentioned above, and accordingly with appropriate coefficient values the apparatus of FIG. 17 can be used.

Where, as in a signal processing operation such as decoding, multiple different functions must be calculated (e.g. exponentiation, logarithms, trigonometric functions and so on) a single device according to FIG. 17 can be employed with alternative sets of coefficients to calculate different such functions.

Whilst the structure shown in FIG. 17 is particularly suitable for dedicated hardware implementation as a series of simple calculating units, it can also be implemented as an iterative program on, for example, a digital signal processor device. Obviously this represents just a part of the flexibility and scalability brought by the use of such Padé approximations. Indeed, by using the full Padé table, and depending on the path followed to reach the final rational approximation, both accuracy and modularity are ensured.

Other Embodiments and Variants

It will be clear that the above described embodiments are examples only, and that many other embodiments are possible.

For example, rather than providing a correction for the Max-LOG-MAP algorithm, the present embodiments could provide the correction factor for the AVG function described in U.S. Pat. No. 6,760,390.

Whereas the above described embodiments disclose the calculation of the correction factor, in fact, as mentioned above, the Max approximation is reasonable where the absolute difference between the two values is large and, accordingly, in another embodiment, the decoders test whether the magnitude of the difference between the two numbers is a predetermined threshold and, if so, only the maximum is used without the calculation of the additional correction factors disclosed herein. In other words, the decoder uses the calculation described in the present embodiment only where the absolute difference is less than the predetermined threshold.

Other techniques disclosed in, for example, the Harrison paper, the Cheng and Ottoson paper, or the Vallejo et al paper could be employed.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A computer implemented method of approximating the generation of a logarithm of a sum of exponents, for use in a log-MAP decoding operation implemented in a decoder, comprising the steps of:
performing a first operation on data;
calculating a correction term in a second operation;
adding the correction term to the results of the first operation; and
decoding the data using the result of the adding step,
wherein the second operation comprises calculating an approximate correction term by an operation including at least one division stage in which a first result obtained based on said data and at least a first coefficient is divided by a second result obtained based on said data and at least a second coefficient.

2. The method according to claim 1, wherein the first operation comprises finding the maximum of the data, and the second operation comprises approximating the relation $f_c(x)=\log(1+e^{-x})$ where the term (x) corresponds to the absolute difference between the two values.

3. The method according to claim 2, further comprising the step of performing forward and backward recursion, in which the forward and backward probabilities are calculated by using the method of approximating.

4. The method according to claim 1, wherein the second operation comprises calculating a Padé approximant, corresponding to the ratio of two power series, utilizing a predetermined number of stored coefficients.

5. The method according to claim 4, further comprising the step of performing forward and backward recursion in which forward and backward probabilities are calculated by using the method of approximating.

6. The method according to claim 1, wherein the second operation comprises calculating a continued fraction, utilizing a predetermined number of stored coefficients.

7. The method according to claim 6, further comprising executing a succession of continued fraction execution stages each comprising addition of a first value to a constant to provide a sum, multiplication of a second value by a selected one of a plurality of stored constants to generate a product, and division of said product by said sum to generate a stage output which may form the first value for a further said execution stage, if any.

8. The method according to claim 7, further comprising the step of performing forward and backward recursion, in which forward and backward probabilities are calculated by using the method of approximating.

9. The method according to claim 1, further comprising the step of performing forward and backward recursion, in which the forward and backward probabilities are calculated by using the method of approximating.

10. The method according to claim 6, further comprising the step of performing forward and backward recursion, in which forward and backward probabilities are calculated by using the method of approximating.

11. An apparatus for approximating the generation of a logarithm of a sum of exponents, for use in a log-MAP decoding operation implemented in a MAP decoder, comprising;
a MAP decoder for performing a first operation on data, calculating a correction term in a second operation, adding the correction term to the results of the first operation, and decoding the data using the result of the adding,
wherein the second operation comprises calculating an approximate correction term by an operation including at least one division stage in which a first result obtained based on said data and at least a first coefficient is divided by a second result obtained based on said data and at least a second coefficient.

12. The apparatus of claim 11, wherein the MAP decoder performs forward and backward recursion, in which forward and backward probabilities are calculated by using a method of approximating.

13. The apparatus of claim 12, wherein the MAP decoder is contained in a radio receiver.

14. The apparatus of claim 12, wherein the MAP decoder is contained in a module terminal.

15. The apparatus of claim 11, wherein the MAP decoder is contained in a radio receiver.

16. The apparatus of claim 11, wherein the MAP decoder is contained in a module terminal.

* * * * *

UNITED STATES PATENT AND TRADEMARK OFFICE
CERTIFICATE OF CORRECTION

PATENT NO. : 7,594,161 B2  Page 1 of 1
APPLICATION NO. : 11/225262
DATED : September 22, 2009
INVENTOR(S) : Thierry Lestable It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 983 days.

Signed and Sealed this

Twenty-eighth Day of September, 2010

David J. Kappos
*Director of the United States Patent and Trademark Office*